United States Patent
Koshiyama et al.

(10) Patent No.: US 7,179,399 B2
(45) Date of Patent: Feb. 20, 2007

(54) MATERIAL FOR FORMING PROTECTIVE FILM

(75) Inventors: Jun Koshiyama, Kanagawa (JP); Kazumasa Wakiya, Kanagawa (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 432 days.

(21) Appl. No.: 10/147,942

(22) Filed: May 17, 2002

(65) Prior Publication Data

US 2002/0182360 A1 Dec. 5, 2002

(30) Foreign Application Priority Data

May 17, 2001 (JP) ............................... 2001-148369

(51) Int. Cl.
*H01L 23/29* (2006.01)
*H01L 21/4763* (2006.01)
*H01L 21/31* (2006.01)

(52) U.S. Cl. ........................... 252/182.12; 252/182.13; 252/182.23; 252/182.24; 252/182.26; 252/182.28; 252/62.3 Q; 257/789; 257/795; 257/E21.579; 438/496; 438/623; 438/780; 438/781

(58) Field of Classification Search ................ 438/496, 438/623, 694, 780, 781; 257/E21.579, 789, 257/795; 252/182.11, 182.12, 182.13, 182.23, 252/182.24, 182.26, 182.28, 183.11, 62.3 Q; 510/175

See application file for complete search history.

(56) References Cited

U.S. PATENT DOCUMENTS

| 5,202,217 | A | * | 4/1993 | Todoko et al. | ............... 430/191 |
| 6,042,991 | A | * | 3/2000 | Aoai et al. | ............... 430/285.1 |
| 6,165,678 | A | * | 12/2000 | Allen et al. | ............... 430/270.1 |
| 6,258,508 | B1 | * | 7/2001 | Kim et al. | ............... 430/270.1 |
| 6,268,106 | B1 | * | 7/2001 | Park et al. | ............... 430/270.1 |
| 6,410,204 | B1 | * | 6/2002 | Kodama et al. | ......... 430/270.1 |
| 6,497,987 | B1 | * | 12/2002 | Kim et al. | ............... 430/270.1 |
| 6,514,664 | B1 | * | 2/2003 | Touky et al. | ............ 430/270.1 |
| 6,641,974 | B2 | * | 11/2003 | Kim et al. | ............... 430/270.1 |
| 2002/0182360 | A1 | * | 12/2002 | Koshiyama et al. | ........ 428/40.5 |

FOREIGN PATENT DOCUMENTS

JP 2000-195955 7/2000

* cited by examiner

*Primary Examiner*—Joseph d. Anthony
(74) *Attorney, Agent, or Firm*—Carrier, Blackman & Associates, P.C.; Joseph P. Carrier; William D. Blackman

(57) ABSTRACT

A material for forming a protective film comprising an organic solvent and a compound having at least two alicyclic structures.

21 Claims, No Drawings

MATERIAL FOR FORMING PROTECTIVE FILM

BACKGROUND OF THE INVENTION

1. Field of the Invention

The present invention relates to a material for forming a protective film that is embedded in a hole pattern, when a multilayered wiring structure is formed.

2. Description of the Related Art

In recent years, with increased integration of semiconductor elements and a reduction of chip size, development of fine and multilayered wiring has been progressing. Under the circumstances, the size of a hole pattern that is formed by photolithography techniques is further miniaturized.

To form such a miniaturized hole pattern, use of metal such as Cu has been proposed, and therewith lithography techniques have been applied, in which the Damascene method or the Dual Damascene method is used.

In the Dual Damascene method, when upper wiring is formed after formation of a hole pattern, it is necessary to embed the hole pattern once to protect lower wiring from damage due to etching. It has been proposed that a photoresist composition is used as a material for forming the protective film.

However, the above described photoresist composition has a disadvantage in that an air bubble that is called "void" generates when the composition is embedded in a via hole with a large aspect ratio.

To solve the above problem, Japanese Patent Application Laid-Open (Kokai) No. 2000-195955 discloses embedding materials wherein a thermal crosslinking compound such as a melamine derivative or benzoguanamine derivative is used. The embedding feature and flatness of these embedding materials have been improved when compared with those of photoresist compositions, but the feature and the flatness have not satisfied yet the features that are required today.

SUMMARY OF THE INVENTION

An object of the present invention is to provide a material for forming a protective film, which has an excellent embedding feature and flatness, when an embedding material is embedded in a via hole.

The present invention provides a material for forming a protective film comprising an organic solvent and a compound having at least two alicyclic structures.

DETAILED DESCRIPTION OF THE PREFERRED EMBODIMENTS

To solve the above described problem, the material for forming a protective film of the present invention comprises a compound having at least two alicyclic structures, which is dissolved in an organic solvent. Examples of the above described compound having at least two alicyclic structures include spiro hydrocarbon compounds, bicyclic monoterpene compounds, adamantane compounds and steroid compounds.

Specific examples of such compounds include monoterpene compounds represented by the following general formulas 1 to 4:

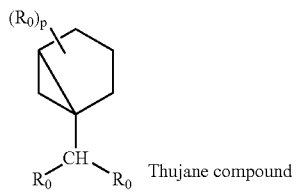

[Chemical Formula 1]

Thujane compound

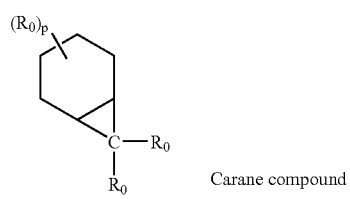

[Chemical Formula 2]

Carane compound

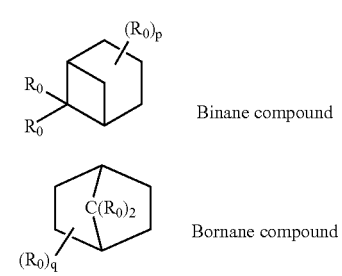

[Chemical Formula 3]

Binane compound

[Chemical Formula 4]

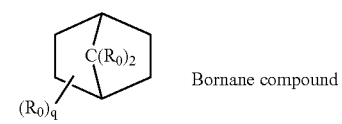

Bornane compound adamantane compounds represented by the following general formula 5:

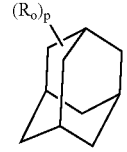

[Chemical Formula 5]

and further, steroid compounds represented by the following general formula 6:

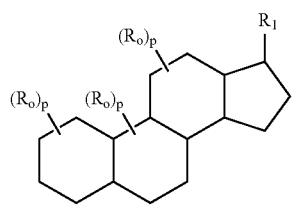

[Chemical Formula 6]

wherein $R_0$ represents a lower alkyl group containing 1 to 4 carbon atoms, a hydrogen atom, a hydroxyl group, a carboxyl group, a sulfonic acid group, a hydroxyalkyl group or an alkoxyalkyl group, and $R_1$ represents a straight or branched chain hydrocarbon group containing 2 to 10 carbon atoms that may be substituted by a carboxyl group, a hydroxyl group or the like. It is particularly preferable that $R_1$ is a hydrocarbon group containing 3 to 6 carbon atoms and having a carboxyl group. Each of p and q represents an integer of 0 to 3 and 0 to 5, respectively.

Specific examples of the above listed compounds include: Spiro hydrocarbon compounds such as spiro heptane, Spiro octane or spiro undecane; bicyclic monoterpene compounds such as thujanes (e.g. thujane, sabinene, etc.), caranes (e.g. carane, etc.), pinanes (e.g. pinane, norpinane, etc.) or bornanes (e.g. bornane, norbornane, tricyclene, borneol, 1,3,3-trimethyl-norbornane-2-ol, camphor oxime, 3-(hydroxymethylene)camphor, 3-camphor carboxylate, etc.); adamantane compounds such as 1-hydroxyadamantane, 1-hydroxymethyladamantane, 1-adamantane carboxylate, 2-hydroxy-2-methyladamantane or 2-adamantane carboxylate; and steroid compounds such as sterols (e.g. cholestanol, coprostanol, cholesterol, scymnol, etc.), bile acid (cholanic acid, lithocholic acid, deoxycholic acid, α-hyodeoxycholic acid, cholic acid, etc.)

To obtain a high dry etching rate, it is preferable to use a compound which has a low content of unsaturated bond in a structure thereof and whose molecule size is large.

From this viewpoint, cholic acid and lithocholic acid are preferable.

Moreover, it is also preferable to add a nitrogen-containing compound to such compounds having two or more alicyclic structures.

Examples of the above described nitrogen-containing compound include nitrogen-containing compounds having at least two amino groups substituted by hydroxyalkyl groups, alkoxyalkyl groups, or both of the groups. Examples of such a nitrogen-containing compounds include melamine compounds, urea compounds, guanamine compounds, acetoguanamine compounds, benzoguanamine compounds, glycol uryl compounds, succinylamide compounds, ethylene urea compounds, etc., in which hydrogen atoms of amino groups are substituted by methylol groups, alkoxymethyl groups or both of the groups.

These nitrogen-containing compounds can be obtained by reacting the above described melamine compounds, urea compounds, guanamine compounds, acetoguanamine compounds, benzoguanamine compounds, glycol uryl compounds, succinylamide compounds or ethylene urea compounds, with formalin in boiling water for methylolation, or further reacting the obtained reaction product with a lower alcohol such as methanol, ethanol, n-propanol, isopropanol, n-butanol or isobutanol for alkoxylation.

Of these nitrogen-containing compounds, benzoguanamine compounds, guanamine compounds, melamine compounds and urea compounds are preferable, in which at least two hydrogen atoms of amino groups are substituted by methylol groups or lower alkoxy methyl groups, or both of the groups. In particular, triazine compounds such as benzoguanamine compounds, guanamine compounds or melamine compounds are preferable. In addition, it is more preferable that these compounds have, on an average, 3 or more to less than 6 methylol groups or lower alkoxy methyl groups per triazine ring.

Specific examples of such a nitrogen-containing compounds include: benzoguanamine compounds such as methoxymethylated benzoguanamine, ethoxymethylated benzoguanamine, isopropoxymethylated benzoguanamine, isobutoxymethylated benzoguanamine or methoxymethylated ethoxymethylated benzoguanamine; melamine compounds such as methoxymethylated melamine, ethoxymethylated melamine, isopropoxymethylated melamine, isobutoxymethylated melamine or methoxymethylated isobutoxymethylated melamine; glycol uryl compounds such as methoxymethylated glycol uryl, ethoxymethylated glycol uryl or isobutoxymethylated glycol uryl; etc.

The mixed amount of a nitrogen-containing compound is preferably 0.5% to 30% by weight, particularly preferably 1% to 15% by weight with respect to a compound having at least two alicyclic structures.

When the material for forming a protective film of the present invention is applied on a substrate and then dried by heating, the above described nitrogen-containing compound initiates a crosslinking reaction to a hydroxyl group and a carboxyl group of the above described compound having at least two alicyclic structures, and so the obtained film is able to have preferred properties as a protective film.

Moreover, in the present invention, in addition to the essential ingredients of the above described compound having at least two alicyclic structures and nitrogen-containing compound, an acid compound, a high light-absorbing ingredient and a resin ingredient may also be added as any given additive ingredient.

Examples of an acid compound include inorganic acids or organic acids having a sulfur-containing acid residue or ester thereof, compounds generating acid with active light (a photo acid-generating agent), etc. These acid compounds have such effects that the compounds decrease baking temperature to simplify processes.

Examples of inorganic acid having a sulfur-containing acid residue include sulfuric acid, sulfurous acid, thiosulfuric acid and the like, and sulfuric acid is particularly preferable. Examples of organic acid having a sulfur-containing acid residue include organic sulfonic acids. Examples of the ester of these inorganic and organic acids include organic sulfates, organic sulfites and the like. Of these, organic sulfonic acids, for example, compounds represented by the following general formula (I) is particularly preferable:

[Chemical Formula 7]

$$R^1\text{—}X \qquad (I)$$

wherein $R^1$ represents a hydrocarbon group that may or may not have a substituent, and X represents a sulfonic acid group.

In the above described general formula (I), $R^1$ is preferably a hydrocarbon group having 1 to 20 carbon atoms, and this hydrocarbon group may be saturated or unsaturated, and may also be straight, branched chain and cyclic. Examples of a substituent include halogen atoms such as a fluorine atom, a sulfonic acid group, a carboxyl group, a hydroxyl group, an amino group, a cyano group, etc., and either one or a plurality of these substituents may be introduced.

Specific examples of $R^1$ include aromatic hydrocarbon groups such as a phenyl group, a naphthyl group or an anthracenyl group, and of these, a phenyl group is preferable. Moreover, an aromatic ring of these aromatic hydrocarbon groups may be bound with one or more alkyl groups having 1 to 20 carbon atoms. Furthermore, this aromatic ring may be substituted by one or more substituents such as a halogen atom such as a fluorine atom, a sulfonic acid group, a carboxyl group, a hydroxyl group, an amino group and a cyano group.

Considering an effect of improving the bottom form of a photoresist pattern, particularly preferred examples of such organic sulfonic acid include nonafluorobutanesulfonic acid, methanesulfonic acid, trifluoromethanesulfonic acid, dodecylbenzenesulfonic acid, p-toluenesulfonic acid or a mixture thereof.

Examples of an acid-generating agent include:

(a) bissulfonyldiazomethanes such as bis(p-toluenesulfonyl) diazomethane, methylsulfonyl-p-toluenesulfonyldiazomethane, 1-cyclohexylsulfonyl-1-(1,1-dimethylethylsulfonyl)diazomethane, bis(1,1-dimethylethylsulfonyl) diazomethane, bis(1-methylethylsulfonyl)diazomethane, bis(cyclohexylsulfonyl)diazomethane, bis(2,4-dimethylphenylsulfonyl)diazomethane, bis(4-ethylphenylsulfonyl)diazomethane, bis(3-methylphenylsulfonyl)diazomethane, bis(4-methoxyphenylsulfonyl)diazomethane, bis(4-fluorophenylsulfonyl)diazomethane, bis(4-chlorophenylsulfonyl)diazomethane and bis(4-tert-butylphenylsulfonyl)diazomethane;

(b) nitrobenzyl derivatives such as p-toluenesulfonic acid-2-nitrobenzyl, p-toluenesulfonic acid-2,6-dinitrobenzyl and p-trifluoromethylbenzenesulfonic acid-2,4-dinitrobenzyl;

(c) polyhydroxy compounds and aliphatic or aromatic sulfonates such as pyrogallol methane sulfonate (pyrogallol trimesylate), pyrogallol benzene sulfonate, pyrogallol p-toluene sulfonate, pyrogallol p-methoxybenzene sulfonate, pyrogallol mesitylene sulfonate, pyrogallol benzyl sulfonate, alkyl gallate methane sulfonate, alkyl gallate benzene sulfonate, alkyl gallate p-toluene sulfonate, alkyl gallate p-methoxybenzene sulfonate, alkyl gallate mesitylene sulfonate-and alkyl gallate benzyl sulfonate;

(d) onium salts such as diphenyl iodonium tetrafluoroborate, diphenyl iodonium hexafluorophosphate, diphenyl iodonium hexafluoroantimonate, diphenyl iodonium trifluoromethanesulfonate, (4-methoxyphenyl)phenyl iodonium hexafluoroantimonate, (4-methoxyphenyl)phenyl iodonium trifluoromethanesulfonate, bis(p-tert-butylphenyl) iodonium tetrafluoroborate, bis(p-tert-butylphenyl)iodonium hexafluorophosphate, bis(p-tert-butylphenyl) iodonium hexafluoroantimonate, bis(p-tert-butylphenyl) iodonium trifluoromethanesulfonate, triphenyl sulfonium hexafluorophosphate, triphenyl sulfonium hexafluoroantimonate and triphenyl sulfonium trifluoromethanesulfonate;

(e) sulfonylcarbonyl alkanes such as 2-methyl-2-(p-toluenesulfonyl)propiophenone, 2-(cyclohexylcarbonyl)2-(p-toluenesulfonyl)propane, 2-methanesulfonyl-2-methyl-(4-methylthio)propiophenone and 2,4-dimethyl-2-(p-toluenesulfonyl)pentane-3-on;

(f) sulfonylcarbonyl diazomethanes such as 1-p-toluenesulfonyl-1-cyclohcxylcarbonyl diazomethane, 1-diazo-1-methylsulfonyl-4phenyl-2-butanone, 1-cyclohexylsulfonyl-1-cyclohexylcarbonyl diazomethane, 1-diazo-1-cyclohcxylsulfonyl-3,3-dimethyl-2-butanone, 1-diazo-1-(1,1-dimethylethyl sulfonyl)-3,3-dimethyl-2-butanone, 1-acetyl-1-(1-methylethylsulfonyl)diazomethane, 1-diazo-1-(p-toluenesulfonyl)-3,3-dimethyl-2-butanone, 1-diazo-1-benzenesulfonyl-3,3-dimethyl-2-butanone, 1-diazo-1-(p-toluenesulfonyl)-3-methyl-2-butanone, 2-diazo-2-(p-toluenesulfonyl)cyclohexyl acetate,2-diazo-2-benzenesulfonyl tert-butyl acetate, 2-diazo-2-methanesulfonyl isopropyl acetate, 2-diazo-2-benzenesulfonyl cyclohexyl acetate and 2-diazo-2-(p-toluenesulfonyl)tert-butyl acetate;

(g) benzoin tosylates such as benzoin tosylate and α-methylbenzoin tosylate;

(h) halogen-containing triazine compounds such as 2-(4-methoxyphenyl)-4,6-bis(trichloromethyl)-1,3,5-triazine, 2-(4-methoxynaphtyl)-4,6-bis(trichloromethyl)-1,3,5-triazine, 2-[2-(2-furyl)ethenyl]-4,6-bis(trichloromethyl)-1,3,5-triazine, 2-[2-(5-methyl-2-furyl)ethenyl]-4,6-bis(trichloromethyl)-1,3,5-triazine, 2-[2-(3,5-dimethoxyphenyl)ethenyl]-4,6-bis(trichloromethyl)-1,3,5-triazine, 2-[2-(3,4-dimethoxyphenyl)ethenyl]4,6-bis(trichloromethyl)-1,3,5-triazine, 2-3,4-methylenedioxyphenyl)-4,6-bis(trichloromethyl)-1,3,5-triazine, tris(1,3-dibromopropyl)-1,3,5-triazine, tris(2,3-dibromopropyl)-1,3,5-triazine and tris(2,3-dibromopropyl)isocyanurate.

(i) oxime sulfonate compounds such as α-(methylsulfonyloxy imino)phenylacetonitrile, α-(toluenesulfonyloxy imino)phenylacetonitrile, α-(p-chlorobenzenesulfonyloxy imino)phenylacetonitrile, α-(4-nitrobcnzenesulfonyloxy imino)phenylacetonitrile, α-(4-nitro-2-trifluoromethylbenzenesulfonyloxy imino)phenylacetonitrile, α-(methylsulfonyloxy imino)-1-phenylacetonitrile, α-methylsulfonyloxy imino)4-methoxyphenylacetonitrile, α-(methylsulfonyloxy imino)1-(p-methylphenyl)acetonitrile, α-(methylsulfonyloxy imino)-1-(p-methoxyphenyl)acetonitrile, α-(benzenesulfonyloxy imino)4-chlorophenylacetonitrile, α-(benzenesulfonyloxy imino)-2,4-dichlorophenylacetonitrile, α-(benzenesulfonyloxy imino)-2,6-dichlorophenylacetonitrile, α-(benzenesulfonyloxy imino)-2,4-(dichlorophenylacetonitrile, α-(benzenesulfonyloxy imino)-4-methoxyphenylacetonitrile, α-(2-chlorobenzenesulfonyloxy imino)-4-methoxyphenylacetonitrile, α-(benzenesulfonyloxy imino)-2-thienylacetonitrile, α-(4-dodecylbenzenesulfonyloxy imino)phenylacetonitrile, α-(toluenesulfonyloxy imino)-4-methoxyphenylacetonitrile, α-(4-dodecylbenzenesulfonyloxy imino)-4-methoxyphenylacetonitrile, α-(trisulfonyloxy imino)-3-thienylacetonitrile, α-(benzenesulfonyloxy imino)-4-methoxyphenylacetonitrile, α-(ethylsulfonyloxy imino)-4-methoxyphenylacetonitrile, α-(trifluoromethylsulfonyloxy imino)-4-methoxyphenylacetonitrile, α-(propylsulfonyloxy imino)-4methoxyphenylacetonitrile, α-(methylsulfonyloxy imino)-4bromophenylacetonitrile, α-(methylsulfonyloxy imino)-1-cyclopentenylacetonitrile, α-(methylsulfonyloxy imino)-1-cyclohexenylacctonitrile, α-(methylsulfonyloxy imino)-1-cycloheptenylacetonitrile, α-(methylsulfonyloxy imino)-1-cyclooctynylacetonitrile, α-(trifluoromethylsulfonyloxy imino)-1-cyclopentenylacetonitrile, α-(trifluoromethylsulfonyloxy imino)-1-cyclohexenylacetonitrile, α-(ethylsulfonyloxy imino) ethylacetonitrile, α-(propylsulfonyloxy imino) propylacetonitrile, α-(cyclohexylsulfonyloxy imino) cyclopentylacetonitrile, α-(cyclohexylsulfonyloxy imino) cyclohexylacetonitrile, α-(cyclohexylsulfonyloxy imino)-1-cyclopentenylacetonitrile, α-(1-naphtylsulfonyloxy imino)-4-methoxybenzyl cyanide, α-(2-naphtylsulfonyloxy imino)-4-methoxybenzyl cyanide, α-(1-naphtylsulfonyloxy imino)benzyl cyanide, α-(2-naphtylsulfonyloxy imino)benzyl cyanide, α-(10-camphorsulfonyloxy imino)-4-methoxybenzyl cyanide, α-(10-camphorsulfonyloxy imino)benzyl cyanide, α-(3-camphorsulfonyloxy imino)-4-methoxybenzyl cyanide, α-(3-bromo-10-camphorsulfonyloxy imino)-4-methoxybenzyl cyanide and compounds represented by the following general formula (II) to (XIII):

[Chemical Formula 8]

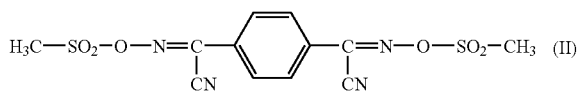

(II)

[Chemical Formula 9]

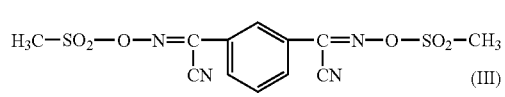

(III)

-continued

[Chemical Formula 10]

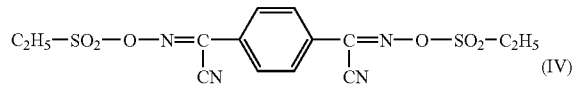
(IV)

[Chemical Formula 11]

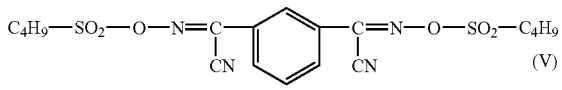
(V)

[Chemical Formula 12]

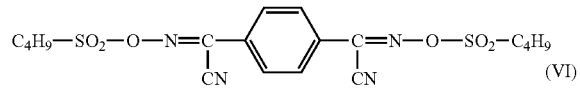
(VI)

[Chemical Formula 13]

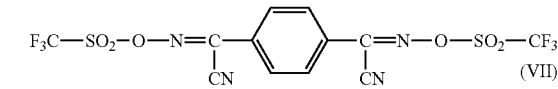
(VII)

[Chemical Formula 14]

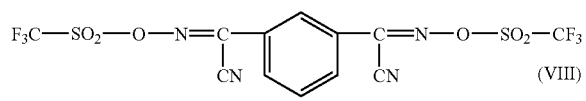
(VIII)

[Chemical Formula 15]

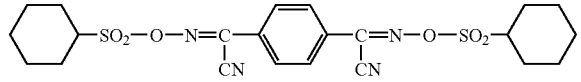
(IX)

[Chemical Formula 16]

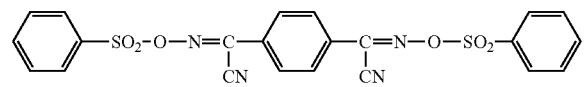
(X)

[Chemical Formula 17]

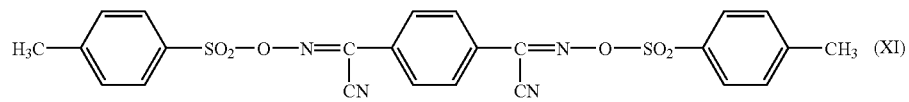
(XI)

[Chemical Formula 18]

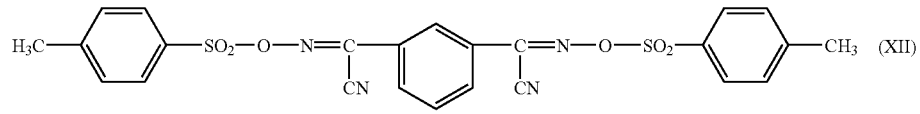
(XII)

[Chemical Formula 19]

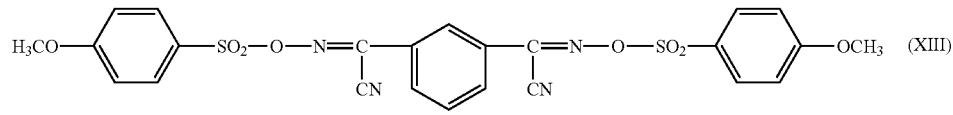
(XIII)

and, (j) imide compounds such as N-methylsulfonyloxy succinimide, N-isopropylsulfonyloxy succinimide, N-chloroethylsulfonyloxy succinimide, N-(p-methoxyphenyl)sulfonyloxy succinimide, N-(p-vinylphenyl)sulfonyloxy succinimide, N-naphtylsulfonyloxy succinimide, N-phenylsulfonyloxy succinimide, N-(2,3,6-triphenyl)sulfonyloxy succinimide, N-methylsulfonyloxy maleimide, N-isopropylsulfonyloxy maleimide, N-chloroethylsulfonyloxy maleimide, N-(p-methoxyphenyl)sulfonyloxy maleimide, N-(p-vinylphenyl)sulfonyloxy maleimide, N-naphtylsulfonyloxy maleimide, N-phenylsulfonyloxy maleimide, N-2,3,6-triphenyl)sulfonyloxy maleimide, N-methylsulfonyloxy phthalimide, N-isopropylsulfonyloxy phthalimide, N-chloroethylsulfonyloxy phthalimide, N-(p-methoxyphenyl)sulfonyloxy phthalimide, N-(p-vinylphenyl)sulfonyloxy phthalimide, N-naphtylsulfonyloxy phthalimide, N-phenylsulfonyloxy phthalimide and N-(2,3,6-triphenyl)sulfonyloxy phthalimide.

The mixed amount of these acidic compounds is, in the case of acid, 0.1% to 20% by weight, particularly preferably 0.5% to 15% by weight with respect to a compound having at least two alicyclic structures, and in the case of an acid-generating agent, 0.1% to 30% by weight, particularly preferably 0.5% to 20% by weight with respect to a compound having at least two alicyclic structures.

A high light-absorbing ingredient is not particularly limited, to the extent that the ingredient has a high ability to absorb light in a photosensitive wavelength area of a photosensitive ingredient in the photoresist layer obtained by the present invention, and is able to prevent a standing wave generated by reflection from a substrate or diffusion due to unevenness on a substrate surface. As such a high light-absorbing ingredient, any of a salicilate compound, a benzophenon compound, a benzotriazole compound, a cyanoacrylate compound, an azo compound, a polyene compound, an anthraquinone compound, a bisphenyl sulfone compound, bisphenyl sulfoxide compound, an anthracene compound, etc., can be used.

In terms of solubility in a nitrogen-containing compound or solvent, as the above described ingredient, a benzophenon compound, a bisphenyl sulfone compound, bisphenyl sulfoxide compound, an anthracene compound, etc., are preferably used. Of these, there is preferably used at least one kind of hydroxy compound selected from benzophenons having at least two hydroxyl groups, i.e. polyhydroxybenzophenons, bisphenyl sulfones having at least two hydroxyl groups, bisphenyl sulfoxides having at least two hydroxyl groups and anthracenes having at least one hydroxyl group or hydroxyalkyl group. For example, where a KrF excimer laser is used, an anthracene compound or bisphenyl sulfone compound is particularly preferable among the above compounds. These compounds may be used singly or in combination of two or more kinds of compounds.

Examples of the above described benzophenons having at least two hydroxyl groups, i.e. polyhydroxybenzophenons, include 2,4-dihydroxybenzophenon, 2,3,4-trihydroxybenzophenon, 2,2',4,4'-tetrahydroxybenzophenon, 2,2',5,6'-tetrahydroxybenzophenon, 2,2'-dihydroxy-4-methoxybenzophenon, 2,6-dihydroxy-4-methoxybenzophenon, 2,2'-dihydroxy-4,4'-dimethoxybenzophenon, 4-dimethylamino-2'4'-dihydroxybenzophenon, 4-dimethylamino-3'4'-dihydroxybenzophenon, etc.

Examples of bisphenyl sulfonates and bisphenyl sulfoxides that have at least two hydroxyl groups, preferably include bis(hydroxyphenyl)sulfones, bis(hydroxyphenyl)sulfoxides, bis(polyhydroxyphenyl)sulfones and bis(polyhydroxyphenyl)sulfoxides. Specific examples of these compounds include bis(4-hydroxyphenyl)sulfone, bis(3,5-dimethyl-4-hydroxyphenyl)sulfone, bis(4-hydroxyphenyl)sulfoxide, bis(3,5-dimethyl-4-hydroxyphenyl)sulfoxide, bis(2,3-dihydroxyphenyl)sulfone, bis(5-chloro-2,3-dihydroxyphenyl)sulfone, bis(2,4-dihydroxyphenyl)sulfone, bis(2,4-dihydroxy-6-methylphenyl)sulfone, bis(5-chloro-2,4-dihydroxyphenyl)sulfone, bis(2,5-dihydroxyphenyl)sulfone, bis(3,4-dihydroxyphenyl)sulfone, bis(3,5-dihydroxyphenyl)sulfone, bis(2,3,4trihydroxyphenyl)sulfone, bis(2,3,4-trihydroxy-6-methylphenyl)sulfone, bis(5-chloro-2,3,4-trihydroxyphenyl)sulfone, bis(2,4,6-trihydroxyphenyl)sulfone, bis(5-chloro-2,4,6-trihydroxyphenyl)sulfone, bis(2,3-dihydroxyphenyl)sulfoxide, bis(5-chloro-2,3-dihydroxyphenyl)sulfoxide, bis(2,4-dihydroxyphenyl)sulfoxide, bis(2,4-dihydroxy-6-methylphenyl)sulfoxide, bis(5-chloro-2,4-dihydroxyphenyl)sulfoxide, bis(2,5-dihydroxyphenyl)sulfoxide, bis(3,4-dihydroxyphenyl)sulfoxide, bis(3,5-dihydroxyphenyl)sulfoxide, bis(2,3,4-trihydroxyphenyl)sulfoxide, bis(2,3,4-trihydroxy-6-methylphenyl)sulfoxide, bis(5-chloro-2,3,4-trihydroxyphenyl)sulfoxide, bis(2,4,6-trihydroxhpenyl)sulfoxide, bis(5-chloro-2,4,6-trihydroxhpenyl)sulfoxide, etc.

Examples of anthracenes having at least one hydroxyl group or hydroxyalkyl group include compounds having an anthracene ring and a substituent. Examples of such compounds include a compound represented by the following general formula (XIV):

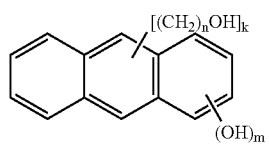

[Chemical Formula 20]

(XIV)

wherein n is an integer of 1 to 10, m is an integer of 0 to 8, and k is an integer of 0 to 6, provided that k and n cannot be 0 simultaneously.

Specific examples of the compound represented by the above general formula (XIV) include 1-hydroxyanthracene, 9-hydroxyanthracene, 1,2-dihydroxyanthracene, 1,5-dihydroxyanthracene, 9,10-dihydroxyanthracene, 1,2,3-trihydroxyanthracene, 1-hydroxymethylanthracene, 9-hydroxymethylanthracene, 9-hydroxyethylanthracene, 9-hydroxyhexylanthracene, 9-hydroxyoctylanthracene, 9,10-dihydroxymethylanthracene, etc., and further, there can preferably be used 9-anthracene carboxylate, 9,10-anthracene dicarboxylate, glycidylated anthracene carboxylate, glycidylated anthracenylmethylalcohol, and a condensation product of anthracenylmethylalcohol and polyvalent carboxylic acid (e.g. oxalic acid, malonic acid, methylmalonic acid, ethylmalonic acid, dimethylmalonic acid, succinic acid, methylsuccinic acid, 2,2-dimethylsuccinic acid, glutaric acid, adipic acid, pimelic acid, etc.)

Of these, anthracenes, particularly 9-anthracene carboxylate and 9,10-anthracene dicarboxylate are preferable, since these compounds meet conditions such as high reactivity and tendency not to generate intermixing, and have a high light-absorbency.

The mixed amount of these light-absorbing compounds is 50% to 200% by weight, preferably 80% to 200% by weight with respect to 100% by weight of a compound having at least two alicyclic structures, but the amount is controlled as appropriate depending on the compound having at least two alicyclic structures, exposure wavelength, etc.

Preferred examples of a resin ingredient include polyamide acid, polysulfones, halogenated polymers, polyacetal, acetal copolymers, α-substituted vinyl polymer, polyamine acid, polybutene sulfonate, acryl resin, etc., and acryl resin having at least one acrylate unit is particularly preferable.

It is preferable to use, as the acryl resin, a polymer obtained by polymerizing glycidyl acrylate, alkyl acrylate such as methyl acrylate, ethyl acrylate and propyl acrylate, 4-(4-hydroxyphenyl)sulfonylphenyl acrylate, a corresponding methacrylate compound thereof, etc. Examples of such a polymer include polyglycidyl acrylate, polymethyl acrylate, polyethyl acrylate, poly[4-(4-hydroxyphenyl)sulfonylphenyl]acrylate, a copolymer of glycidyl acrylate and methylacrylate, corresponding methacrylate polymers or copolymers thereof, etc. Of these, a copolymer of glycidyl methacrylate and methyl methacrylate wherein weight ratio of both compounds is 2:8 to 8:2, particularly 7:3 to 3:7, and poly[4-(4-hydroxyphenyl)sulfonylphenyl]methacrylate are advantageous in terms of tendency not to generate an intermixing layer.

Moreover, these resin ingredients may be substituted by, for example, the above described high light-absorbing ingredients so as to allow resin itself to have an absorbing ability.

In a case of mixing a resin ingredient, the amount of a compound having at least two alicyclic structures is 3% to 200% by weight, preferably 5% to 100% by weight with respect to 100% by weight of the resin ingredient.

Each of the above described ingredients is dissolved in an organic solvent for use. Examples of the organic solvent include ketones such as acetone, methylethylketone, cyclopentanone, cyclohexanone, methylisoamylketone, 2-heptanone and 1,1,1-trimethylacetone; polyhydric alcohols and derivatives thereof such as ethylene glycol, ethylene glycol monoacetate, diethylene glycol, diethylene glycol monoacetate, propylene glycol, propylene glycol monoacetate, or monomethyl ether, monoethyl ether, monopropyl ether, monobutyl ether or monophenyl ether of these compounds;

cyclic ethers such as dioxane; esters such as ethyl lactate, methyl acetate, ethyl acetate, butyl acetate, methyl pyruvate, ethyl pyruvate, 3-methoxy methyl propionate and 3-ethoxy ethyl propionate; etc. These compounds may be used singly, or two or more kinds may be used in combination.

The above described organic solvent is mixed so that the total solid concentration becomes 1% to 15% by weight, preferably 3% to 10% by weight.

Further, a surfactant can be added for improvement of applicability or prevention of striation. Examples of the surfactant include fluorochemical surfactants such as Surflon SC-103, SR-100 (Asahi Glass Co.); EF-351 (Tohoku Hiryo K.K.); Fluorad Fc-431, Fluorad Fc-135, Fluorad Fc-98, Fluorad Fc-430, Fluorad Fc-176 (Sumitomo 3M, Ltd.); Megafax R-08 (Dainippon Ink and Chemicals, incorporated); etc., and the added amount is preferably selected from a range of less than 2,000 ppm with respect to the solid portion of the composition of the present invention.

The mixed amount of the above described compound having at least two alicyclic structures is preferably 1% by weight to 15% by weight in an organic solvent. In terms of flatness and embedded feature, a range of 3% by weight to 10% by weight is particularly preferable.

EXAMPLES

Some examples are provided below to describe the present invention more specifically.

Example 1

A hole pattern with an aspect ratio of 4.5 (hole diameter is 220 nm) was formed to a substrate with a $SiO_2$ film formed thereon, and then a material for forming a protective film obtained by dissolving cholic acid in propylene glycol monomethyl ether and setting the solid concentration thereof at 10 mass %, was applied thereon. Thereafter, the substrate was subjected to heating at 180° C. for 1 minute to form a protective film inside the hole pattern.

When the substrate in this state was observed using SEM (scanning electron microscope), the hole was completely embedded and the upper part of the hole pattern was flat.

Comparison Example 1

The same operations as in Example 1 were carried out to embed a hole, with the only exception that the material for forming a protective film used in Example 1 was replaced by a benzoguanamine propylene glycol monomethyl ether solution (solid concentration: 5% by weight). When the embedded feature and flatness were observed, an air-bubble that is called void generated inside the hole.

Comparison Example 2

The same operations as in Example 1 were carried out to embed a hole, with the only exception that the material for forming a protective film used in Example 1 was replaced by an ethyl lactate solution (solid concentration: 5% by weight) of PAC-101 obtained by crosslinking a diphenylsulfone substituent to an acryl resin and MX-750 that is a methoxymethylated melamine compound (weight ratio=8:2). When the embedded feature and flatness were observed, the hole could not completely be embedded.

EFFECT OF THE INVENTION

According to the present invention, in a process of forming multilayered wiring such as the Dual Damascene method, by using a material for forming a protective film containing a compound having at least two alicyclic structures, it becomes possible to obtain a flat film without generation of an air-bubble, when the material is applied to a hole pattern.

What is claimed is:

1. A method of embedding a hole pattern in a substrate including a via hale with a large aspect ratio, comprising the steps of:
   forming a material to be embedded including an organic solvent and a film-forming compound which comprises at lease two alicyclic structures and which does not generate bubbles when embedded in a via hole; and
   applying the material on a substrate including a via hole with a large aspect ratio to form a protective film with complete embedding and a flat upper surface.

2. The method according to claim 1, wherein the material further includes at least one nitrogen-containing compound having at least two amino groups substituted by hydroxyalkyl groups, alkoxyalkyl groups or both of these groups, and the method further comprises the step of heating the material applied on the substrate.

3. A material for being embedded in a via hole to form a protective film having excellent embedding and flatness characteristics, consisting essentially of an organic solvent and a film-forming compound which comprises at least two alicyclic structures, and wherein said material does not generate bubbles when embedded in a via hole.

4. The material for forming a protective film according to claim 3, wherein said film-forming compound comprises at least one component selected from the group consisting of spiro hydrocarbon compounds, bicyclic monoterpene compounds, adamantine compounds and steroid compounds.

5. The material for forming a protective film according to claim 3, wherein said film-forming compound comprises at least one steroid compound.

6. The material for forming a protective film according to claim 3, wherein said film-forming compound comprises at least one bile acid compound.

7. The material for forming a protective film according to claim 6, wherein said bile acid compound comprises at least one component selected from the group consisting of cholanic acid, lithocholic acid, deoxycholic acid, α-byodeoxycholic acid, and cholic acid.

8. The material for forming a protective film according to claim 3, wherein said film-forming compound has at least one substituent selected from hydroxyl groups and carboxyl groups.

9. The material for forming a protective film according to claim 3, wherein the material forms a protective film with complete embedding and a flat upper surface when embedded in a via hole.

10. The material for forming a protective film according to claim 3, wherein said material includes 3–10 wt. % of said film forming compound.

11. A material for forming a protective film, comprising:
   an organic solvent;
   a film-forming compound which comprises at least two alicyclic structures;
   at least one nitrogen-containing compound having at least two amino groups substituted by hydroxyalkyl groups, alkoxyalkyl groups or both of these groups; and
   wherein said material does not generate bubbles when embedded in a via hole.

12. The material for forming a protective film according to claim 11, wherein said nitrogen-containing compound is selected from the group consisting of benzoguanamime compounds, guanamine compounds, melamine compounds, and mixtures thereof.

13. The material for forming a protective film according to claim 12, wherein said nitrogen-containing compound is present in a range of 0.5 percent to 30 percent of the total weight of said film-forming compound.

14. The material for forming a protective film according to claim 11, further comprising a compound of an organic or inorganic acid having a sulfur containing acid residue or ester thereof.

15. The material for forming a protective film according to claim 14, wherein the acid compound is of the general formula $R^1$-X, wherein $R^1$ represents a hydrocarbon group that may or may not have a substituent, and wherein X represents a sulfonic acid group.

16. The material for forming a protective film according to claim 11, further comprising an acid generating agent.

17. The material for forming a protective film according to claim 11, further comprising a light absorbing compound.

18. The material for forming a protective film according to claim 11, wherein said film-forming compound comprises at least one component selected from the group consisting of spiro hydrocarbon compounds, bicyclic monoterpene compounds, adamantane compounds and steroid compounds.

19. The material for forming a protective film according to claim 11, wherein said film-forming compound comprises at least one bile acid compound.

20. The material for forming a protective film according to claim 11, wherein said film-forming compound has at least one substituent selected from hydraxyl groups and carboxyl groups.

21. The material for forming a protective film according to claim 11, further comprising an acid compound or an acid generating compound, a high light absorbing ingredient, and a resin ingredient.

* * * * *

UNITED STATES PATENT AND TRADEMARK OFFICE
CERTIFICATE OF CORRECTION

PATENT NO. : 7,179,399 B2
APPLICATION NO. : 10/147942
DATED : February 20, 2007
INVENTOR(S) : Koshiyama et al.

It is certified that error appears in the above-identified patent and that said Letters Patent is hereby corrected as shown below:

Title page:
　　After "*Primary Examiner-*" change "Joseph d. Anthony" to --Joseph D. Anthony--.

Column 1:
　　Line 40, change "have not satisfied yet" to --have not yet satisfied--.

Column 2:
　　Line 36, change "$(R_o)_p$" to --$(R_0)_q$--.

Column 3:
　　Line 2, change "Spiro hydrocarbon compounds such as spiro heptane, Spiro" to --spiro hydrocarbon compounds such as spiro heptane, spiro--.
　　Line 7, change "3-(hydroxym-" to --3-(hydroxy- --.
　　Line 8, change "ethylene)camphor" to --methylene)camphor--.
　　Line 27, change "such a nitrogen-containing" to --such nitrogen-containing--.
　　Line 53, change "such a nitrogen-containing" to --such nitrogen-containing--.
　　Line 58, change "melamine, ethoxym-" to --melamine, ethoxy- --.
　　Line 59, change "ethylated melamine, isopropoxymethylated melamine," to --methylated melamine, isopropoxymethylated melamine,--.

Column 4:
　　Line 27, change "(I) is" to --(I), are--.

Column 5:
　　Line 15, change "sulfonate-and" to --sulfonate and--.
　　Line 29, change "2-(cyclohexylcarbonyl)2-(p-" to --2-(cyclohexylcarbonyl)-2-(p- --.
　　Line 34, change "cyclohcxylcarbonyl" to --cyclohexylcarbonyl--.
　　Line 35, change "methylsulfonyl-4phenyl-2-butanone" to --methylsulfonyl-4-phenyl-2-butanone--.
　　Line 37, change "cyclohcxylsulfonyl"to --cyclohexylsulfonyl--.
　　Line 38, change "(1,1-dimethylethyl sulfonyl)" to --(1;1-dimethylethylsulfonyl)--.

UNITED STATES PATENT AND TRADEMARK OFFICE
CERTIFICATE OF CORRECTION

PATENT NO. : 7,179,399 B2
APPLICATION NO. : 10/147942
DATED : February 20, 2007
INVENTOR(S) : Koshiyama et al.

It is certified that error appears in the above-identified patent and that said Letters Patent is hereby corrected as shown below:

Column 6:
    Line 1, change "ethenyl]4,6-bis" to --ethenyl]-4,6-bis--.
    Line 2, change "2-3,4-" to --2-(3,4- --.
    Line 10, change "α-(4-nitrobcnzenesulfony-" to --α-(4-nitrobenzenesulfonyl- --.
    Line 11, change "loxy imino)phenylacetonitrile, α-(4-nitro-2-trifluorom-" to --oxy imino)phenylacetonitrile, α-(4-nitro-2-trifluoro- --.
    Line 12, change "ethylbenzenesulfonyloxy" to --methylbenzenesulfonyloxy--.
    Line 13, change "α-methylsulfonyloxy imino)4" to --α-(methylsulfonyloxy imino)-4--.
    Line 14, change "imino)1-(p-methylphenyl)" to --imino)-1-(p-methylphenyl)--.
    Line 16, change "(benzenesulfonyloxy imino)4-" to --(benzenesulfonyloxy imino)-4- --.
    Line 23, change "-2-thieny-" to -- -2-thienyl- --.
    Line 24, change "lacetonitrile," to --acetonitrile,--.
    Line 31, change "-4-methoxypheny-" to -- -4-methoxyphenyl- --.
    Line 32, change "lacetonitrile," to --acetonitrile,--; change "imino)-4methoxyphe-" to --imino)-4-methoxyphe- --.
    Line 33, change "imino)-4bro-" to --imino)-4-bro- --.
    Line 36, change "1-cyclohexenylacctonitrile," to --1-cyclohexenylacetonitrile,--.

Column 7:
    Line 48, change "N-chloroet-" to --N-chloro- --.
    Line 49, change "hylsulfonyloxy" to --ethylsulfonyloxy--.
    Line 58, change "N-2,3,6-triphenyl)" to --N-(2,3,6-triphenyl)--.

Column 8:
    Line 65, change "the above described" to --the above-described--.

Column 9:
    Line 3, change "hydroxyl groups, i.e." to --hydroxyl groups, i.e., --.
    Line 13, change "the above described" to --the above-described--.
    Line 14, change "hydroxyl groups, i.e." to --hydroxyl groups, i.e.,--.
    Line 36, change "bis(2,3,4trihydroxyphenyl)" to --bis(2,3,4-trihydroxyphenyl)--.
    Line 48, change "bis(2,4,6-trihydroxyhpenyl)" to --bis(2,4,6-trihydroxyphenyl)--.
    Line 49, change "2,4,6-trihydroxyhpenyl)" to --2,4,6-trihydroxyphenyl)--.

Column 10:
    Line 16, change "(e.g. oxalic acid," to --(e.g., oxalic acid,--.
    Line 52, change "the above described" to --the above-described--.
    Line 58, change "the above described" to --the above-described--.

UNITED STATES PATENT AND TRADEMARK OFFICE
CERTIFICATE OF CORRECTION

PATENT NO. : 7,179,399 B2
APPLICATION NO. : 10/147942
DATED : February 20, 2007
INVENTOR(S) : Koshiyama et al.

It is certified that error appears in the above-identified patent and that said Letters Patent is hereby corrected as shown below:

Column 11:
　Line 6, change "above described" to --above-described--.
　Line 18, change "the above described" to --the above-described--.

Column 12:
　Line 8, change "via hale" to --via hole--.
　Line 12, change "at lease two" to --at least two--.
　Line 33, change "adamantine" to --adamantane--.
　Line 43, change "α-byode-" to --α-hyode- --.
　Line 55, change "film forming compound" to --film-forming compound--.

Column 13:
　Line 10, change "sulfur containing acid" to --sulfur-containing acid--.
　Line 18, change "an acid generating agent." to --an acid-generating agent.--.
　Line 20, change "a light absorbing compound." to --a light-absorbing compound.--.

Column 14:
　Lines 16-17, change "to claim 11, further comprising an acid compound or an acid generating compound, a high light absorbing ingredient, and"
to --to claim 11, further comprising an acid compound or an acid-generating compound, a high light-absorbing ingredient, and--.

Signed and Sealed this

Third Day of July, 2007

JON W. DUDAS
*Director of the United States Patent and Trademark Office*